United States Patent
Boerio et al.

[11] Patent Number: 6,077,567
[45] Date of Patent: Jun. 20, 2000

[54] METHOD OF MAKING SILICA COATED STEEL SUBSTRATES

[75] Inventors: F. James Boerio; Robert H. Turner, both of Cincinnati, Ohio; Catherine E. Taylor, Minneapolis, Minn.

[73] Assignee: University Of Cincinnati, Cincinnati, Ohio

[21] Appl. No.: 08/911,706

[22] Filed: Aug. 15, 1997

[51] Int. Cl.[7] .................................. C08J 7/18; B05D 3/06
[52] U.S. Cl. .................... 427/489; 427/579; 427/534; 427/309; 427/255.5
[58] Field of Search ..................... 427/489, 488, 427/534, 255.5, 579, 309, 255.27, 255.37

[56] References Cited

U.S. PATENT DOCUMENTS

| | | | |
|---|---|---|---|
| 4,759,993 | 7/1988 | Pai et al. | 428/450 |
| 5,206,060 | 4/1993 | Balian et al. | 427/489 |
| 5,679,413 | 10/1997 | Petrmichl et al. | 427/534 |

*Primary Examiner*—Roy V. King
*Attorney, Agent, or Firm*—Frost & Jacobs LLP

[57] ABSTRACT

A silica coated substrate comprises a substrate having a zinc containing surface. A plasma polymerized coating is adhered to the surface. The coating consists essentially of silicon and oxygen and contains minimal amounts of carbon.

13 Claims, 17 Drawing Sheets

MICROWAVE REACTOR CONFIGURATION AFTER MODIFICATIONS— CONFIGURATION 2

FIG. 1 MICROWAVE REACTOR CONFIGURATION AFTER MODIFICATIONS – CONFIGURATION 2

FIG. 5 DEPOSITION PROFILE FOR PPHMDSO ON FERROPLATE, NO STAGE ROTATION

FIG. 6 DEPOSITION PROFILE FOR PPHMDSO ON FERROPLATE, 3 RPM STAGE ROTATION.

SCHEMATIC OF THE GM9540P(B) CORROSION TEST CYCLE.

FIG. 8  APPEARANCE OF E-COATED EG AFTER 40 CYCLES OF THE GM9540P(B) CORROSION TEST.

FIG. 9 APPEARANCE OF PAINTED GALVALUME AFTER 750 HOURS OF THE B117 SALT-SPRAY TEST.

APPEARANCE OF GALVALUME AFTER 1000 HOURS OF THE CLEVELAND CONDENSATE TEST.

METHOD OF MAKING SILICA COATED STEEL SUBSTRATES

FIELD OF THE INVENTION

The invention is a silica coated zinc clad steel substrate produced by deposition onto a zinc containing surface plasma polymerized silicon-containing compositions. More particularly, the invention is to silica-like coatings adhered to a galvanized steel strip, and to a method of applying the silica coating through plasma polymerization of hexamethyldisiloxane ("HMDSO") in the presence of a reactive gas.

BACKGROUND OF THE INVENTION

Steel strip is normally produced at a steel mill in coil form, and then transported to a remote location at which the strip will be cut, formed, and frequently painted or otherwise coated. The steel strip may be oiled, or otherwise protected from oxidation, such as by having phosphate or chromate solution applied thereto. Additionally, the steel strip may be a galvanized strip, such as produced by hot dipping or through an electrical reaction known as electrogalvanizing. Yet another zinc-containing coating is Galvalume®, a composition containing zinc and aluminum. Once received at the manufacturing facility, then the chromate, oil, phosphate or other protective coat is normally removed and the strip further processed.

The application of a chromate solution to steel strip not only is relatively expensive, but also create costs related to the need to dispose of the material in an environmentally acceptable manner. The environmental issues arise not only at the steel plant where the chromate is applied, but also at the manufacturing facility where the chromate is removed. Moreover, there also are costs related to application and removal of the chromate material.

In addition to environmental issues raised by the treatment of the steel, end users continuously seek improved raw materials to enhance the marketability of the resulting end product. Carbon steel strip frequently is used to manufacture steel siding and steel roofing, with those produces necessarily ultimately being located in environments where corrosion and oxidation may occur. Protective coats, such as paint, are usually applied to the finished product to prevent corrosion and oxidation (rust). The paint may not provide an adequate barrier to moisture, particularly if the surface should become scratched or otherwise broken. In that event, moisture in the air will react with the steel and form rust, which either is unsightly or may ultimately cause a product failure.

Previous efforts to apply a protective coating to steel at the steel mill have not been entirely successful, because of environmental issues, end user or manufacturer requirements, or simply cost. For example, not only is it desirable that the protective coating be relatively inexpensive to apply, but same should provide a durable surface which may be painted or otherwise protected. Thus, good adhesion to paint is required. Additionally, as noted, the strip frequently is formed by the manufacturer, so that good adhesion of the protective coat to the strip is also desirable, so that the protective coat will remain after the forming operation.

Plasma polymerization of HMDSO under the influence of non-reactive gases has been used in the past to apply high carbon siloxane-like films to electrogalvanized steel. The resulting films were thereafter post-treated with an oxygen etch, so that the surface would repel water and have improved corrosion resistance.

Similar efforts have been used to permit structural bonding of aluminum through epoxy adhesives. The adhesion between the epoxy adhesives and the siloxane films was poor, and post-treatment with an oxygen plasma revealed that the films were inherently weak. Formation of a silica-like film under the influence of an oxygen carrier provided fair initial strength to the smooth aluminum surface, although the strength was still less than smooth aluminum with no primer. The films even then had poor durability, which could be improved by acid etching the aluminum to a roughened state prior to application of the plasma polymerized film.

Those skilled in the art will recognize that there is a need for a protective coat which may be applied to zinc clad steel strip at the steel mill to overcome the problems of the prior art, and to enhance the usability of the resulting steel product. The disclosed invention meets these and other needs in the art by causing a silica-like coating to be adhered to the zinc coated steel strip, with the silica protective coat being deposited through plasma polymerization of HMDSO under the influence of high power and a large excess of oxygen.

SUMMARY OF THE INVENTION

A silica coated substrate comprises a zinc coated substrate having a surface. A plasma polymerized coat is adhered to the substrate. The coat consists essentially of silicon and oxygen, and contains minimal amounts of carbon.

A corrosion resistant semi-finished steel product comprises a steel substrate having a zinc containing surface. A plasma polymerized coating is adhered to the surface. The coating has a thickness of about 750 nm. The coating consists essentially of silicon, oxygen, and hydroxyl groups. The coating contains minimal amounts of carbon.

A corrosion resistant semi-finished steel product comprises a steel strip having a zinc containing surface which has been plasma etched. A silica-containing coating is adhered to the surface. The coated strip has an average scribe creep of less than 2.4 mm when subjected to the GM9540P (B) corrosion test.

A corrosion resistant semi-finished steel product comprises a steel strip having a zinc containing surface which has been plasma etched. A silica-containing coating is adhered to the surface. The coated strip remains free of black stain for at least 1000 hours in the course of Cleveland condensate tests.

The method of applying silica coatings to substrates comprises the steps of generating a plasma. A zinc coated substrate is located in spaced relation to the plasma. A carrier gas is introduced to the plasma, and reactive ions are thereby caused to be formed. A silicon material is introduced in operative association to the plasma and spaced therefrom. A substantially carbonless polymerization reaction product is created by the reaction of the silicon material with the reactive ions. The substrate is maintained in operative association with the plasma for a period sufficient to cause coating of the substrate by the polymerized reaction product.

These and other objects and advantages of the invention will be readily apparent in view of the following description and drawings.

DESCRIPTION OF THE DRAWINGS

The above and other objects and advantages and novel features of the present invention will become apparent in the following detailed description of the preferred embodiment of the invention illustrated in the accompanying drawings, wherein.

DETAILED DESCRIPTION OF THE INVENTION

Figure 1:
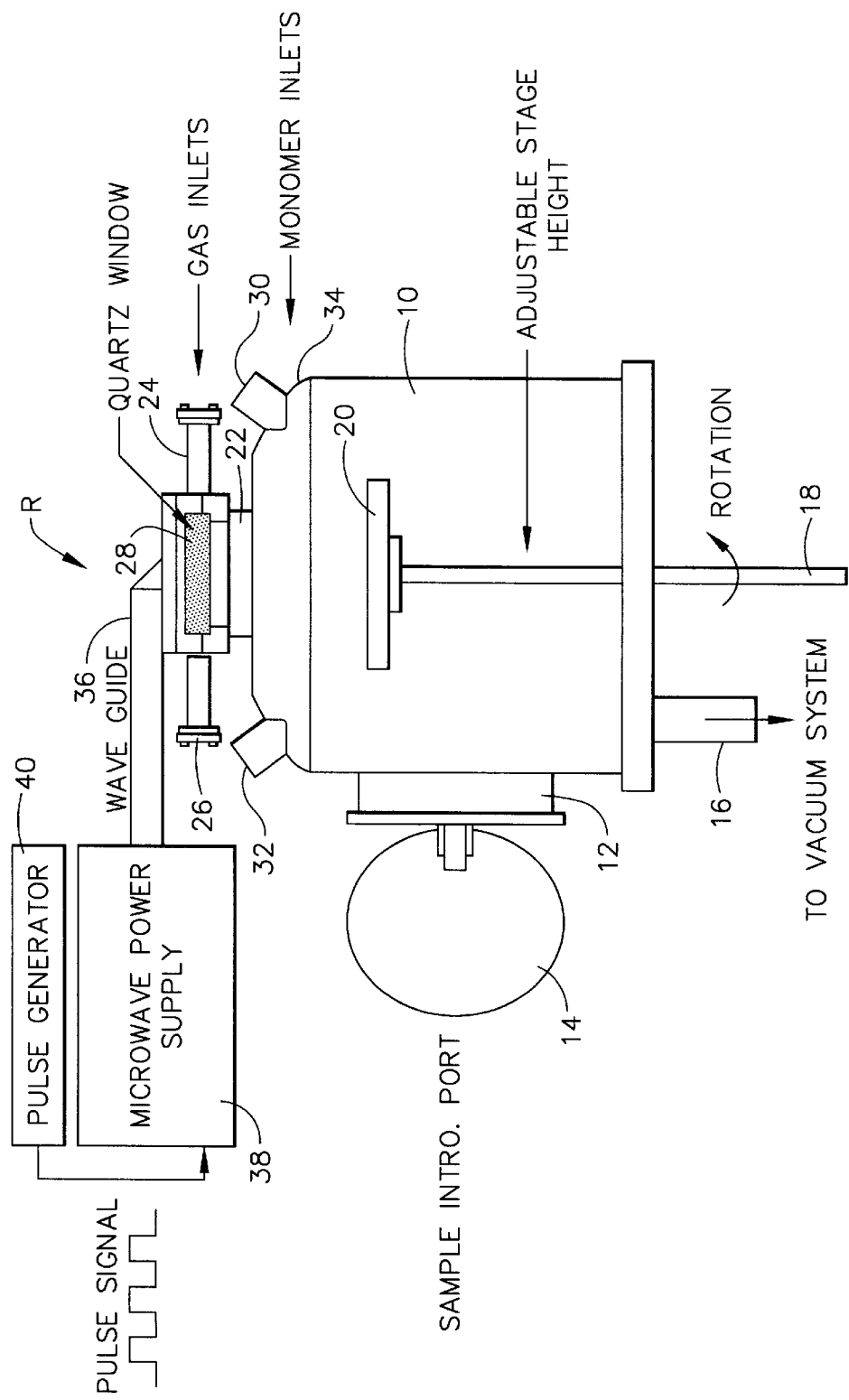
FIG. 1 is a schematic diagram of a microwave reactor in which plasma produced coatings maybe applied to strip surfaces.

FIG. 1 discloses a microwave reactor R comprising a vessel 10, preferably made of stainless steel, having a port 12 closed by hatch 14. Vacuum line 16 communicates with the interior of vessel 10 and a vacuum source (not shown) in order to apply a vacuum of about 0.5 Torr within the vessel 10. Rotatable shaft 18 has a table 20 at its distal end on which coupons or strip specimens may be deposited.

The upper portion of vessel 10 has a port 22 which communicates with gas inlets 24 and 26. Preferably, a quartz window 28 closes port 22. Gas inlets 30 and 32 communicate with vessel 10, preferably at its dome-shaped top 34. The inlets 30 and 32 preferably are angularly oriented toward table 20, and the gas inlets 30 and 32 communicate with corresponding openings in top 34 which are disposed below the openings though which the inlets 24 and 26 communicate with port 22. Preferably, the inlets 30 and 32 are in operable association with a supply of a silicon-containing material which is to be applied to a specimen on the table 20, with the inlets 24 and 26 in operable association with a supply of a reactive gas.

Wave guide 36 communicates with quartz window 28 and microwave power supply 38. The power supply 38 is preferably an alternating current (AC) power source. A pulse generator 40 pulses the microwave power supply 38, with the pulses preferably being set at 500 Hz at a 50% duty. We have found that operation of the reactor R with the pulse generator 40 and microwave power supply 38 may be advantageously utilized to plasma polymerize HMDSO under appropriate reaction conditions, in order to form a silica-like coating on substrates, such as on galvanized carbon steel strip.

We prefer, for the reactor R, that the pressure in the vessel 10 set by the vacuum line 16 be more than 0.200 Torr in order to maintain a remote plasma condition. Should the pressure be lower, then low gas density may cause the plasma to fail. Alternatively, the pressure should not exceed 1.0 Torr, because then the mean free path of active species becomes small and polymerization of HMDSO in the gas phase may occur, with the result that powdery films are created. The pressure condition in the vessel 10 likely is specific to the reactor R.

In order to operate reactor R, then we introduce a carrier or reactive gas, such as oxygen, to the gas inlets 24 and 26 after the plasma has been initiated by operation of the microwave power supply 38. The oxygen gas is continuously supplied to the inlets 24 and 26, in order to assist in maintaining the appropriate pressure within vessel 10 due to the vacuum being applied through vacuum line 16. Introduction of the carrier gas through the inlets 24 and 26 causes the reactive gas molecules to ionize. Additionally, free radicals are formed, UV radiation is emitted, and molecules are excited to higher states of electronic energy without ionizing or forming free radicals. We have found that there should be about 200:1 excess oxygen to silicon monomer in order to create silica-like films.

We have found it advantageous to introduce the silicon-containing material as a gas though the inlets 30 and 32. The inlets 30 and 32 are angularly oriented toward the table 20, which orientation appears to enhance deposition of the silica-like film. We have found that the gas inlets 30 and 32 should be vertically spaced from the gas inlets 24 and 26 and the plasma, because a more consistent silica-like film is then deposited on the substrate. Orienting the gas inlets 30 and 32 in close proximity to the plasma and the inlets 24 and 26 creates a powdery material, possibly resulting from polymerization occurring in the gas phase.

As noted, we have found that there should be a high excess oxygen or reactive gas with relation to the silicon-containing monomer. For the reactor R, we found that the upper limit for the silicon monomer was in the range of 0.2 sccm (standard cubic centimeters per minute), with a lower limit of approximately 0.02 sccm. The oxygen or reactive gas, on the other hand, had an upper limit of approximately 45 sccm, and a lower limit of about 5 sccm. Monomer flows above 0.2 sccm resulted in siloxane-like films, not silica-like films. The upper limit is therefore set by how much organic material the reactive oxygen can remove without depositing siloxane-like films. Should the monomer flow be to low, on the other hand, then low film growth rates occur, and possibly also chemical changes in the film itself. With regard to the oxygen flow, flow rates below 5 sccm exhibited evidence of an organic character, not a silica character. By organic character, we mean that the film has a relatively high carbon content, with one result being that the film is relatively soft. The silica-like films of the invention have a low carbon content, and are hard, inert, and adhere strongly to the substrate.

We have also found that the power applied by the microwave power supply 38 should be high. High power creates the reactive oxygen, which is available to reduce the organic fraction of the monomer. The higher the power, then the more reactive oxygen is produced. Our testing utilized commercially available microwave power supplies, with a need to minimize reflected power. Should the power be to low, then either the plasma will not be sustained, or the reactive oxygen ions will not be sufficient to reduce the organic material to a silica-like film. We have found that a power density of approximately $16.1 \times 10^8$ J/kg results in appropriate reaction conditions for the reactor R when plasma polymerizing HMDSO to create silica-like films.

While we prefer the use of a microwave power supply, those skilled in the art will recognize that other power supplies, such as radio frequency, may be used. Microwave power supply 38 generated sufficient film at suitable deposition rates and thicknesses, whereas RF sources are believed to proceed too slowly for commercial use.

We also investigated the positioning of table 20 relative to window 28. We have found, for the reactor R, that the table 20 should be 110 mm from the window 28. Should the table 20 be closer to the window, then little or no film deposition occurs because the monomer inlet ports 30 and 32 are then the above the table 20. Should the table 20 be further away from window 28, then the deposition rate of the film drops quickly.

Figure 2:
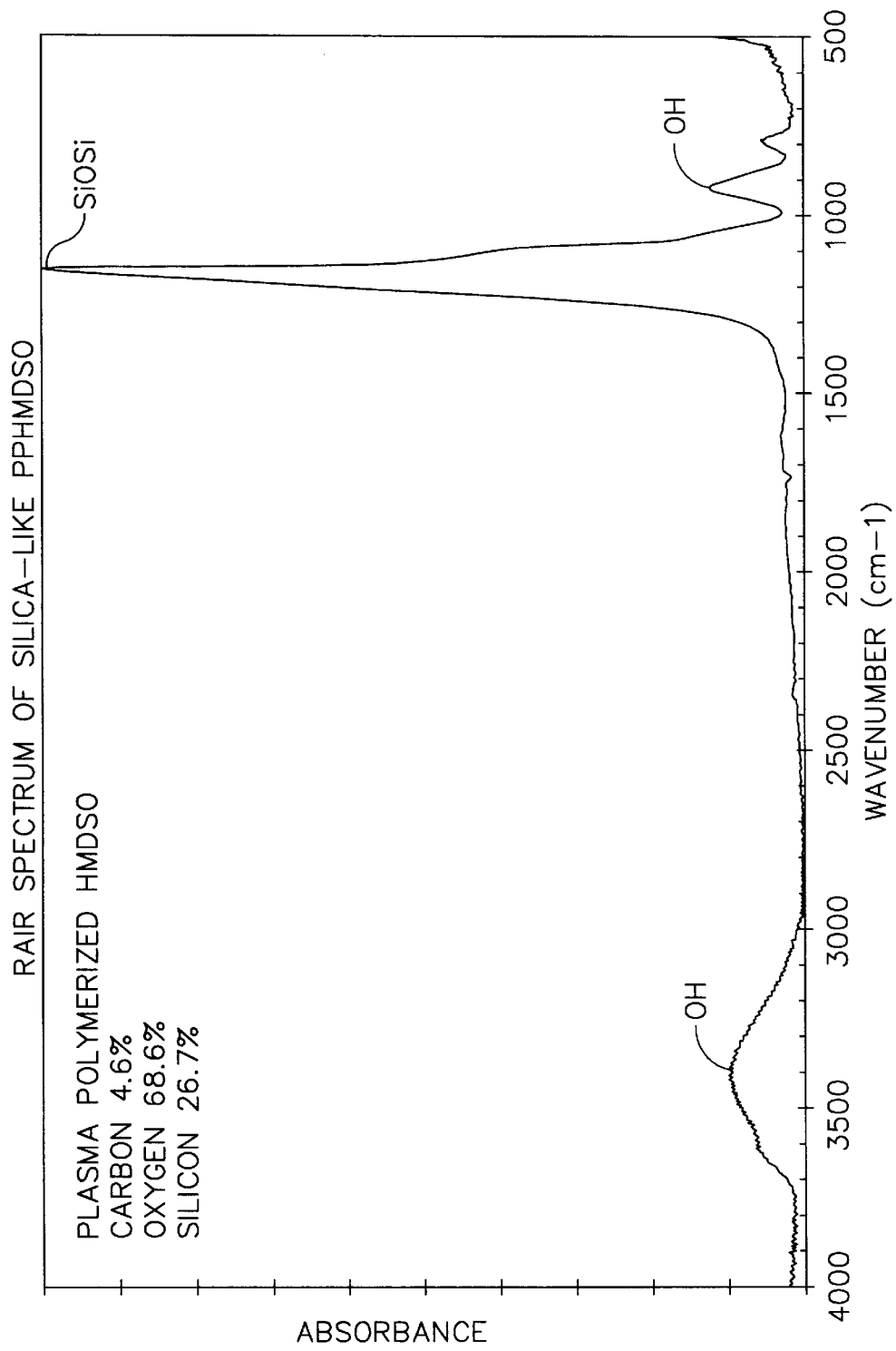
FIG. 2 is an infrared spectrum of a silica-like plasma polymerized coating applied to a substrate.

FIG. 2 is an infrared spectrum of a silica-like plasma polymerized film deposited on a steel substrate in microwave reactor R according to the invention. The film was prepared from HMDSO. Analysis indicated that the film was no more than about 4.6% by weight carbon, about 68.6% by weight oxygen, and about 26.7% by weight silicon. The carbon content likely is overstated, because of the analysis methodology used and the carbon absorption which occurs naturally upon being exposed to ambient conditions.

The infrared spectrum of FIG. 2 establishes that the film contains Si—O—Si linkages, as made clear by the peak at about 1250 wave numbers. Evidence of hydroxyl groups is found at 950 and 3400 wave numbers. The spectrum does not indicate the presence of any meaningful amount of carbon, however. This further reinforces our belief that the carbon analysis likely found surface carbon, or carbon absorbed onto the surface as the specimen was transported from reactor R to the test instrument.

While we prefer HMDSO as the silicon material, other silicon containing monomers, such as tetramethoxysilane and trimethylsilane, may be used. We prefer that the resulting film have some hydroxyl component, because the hydroxyl component appears to enhance adhesion of paint applied to the film.

Figure 3:
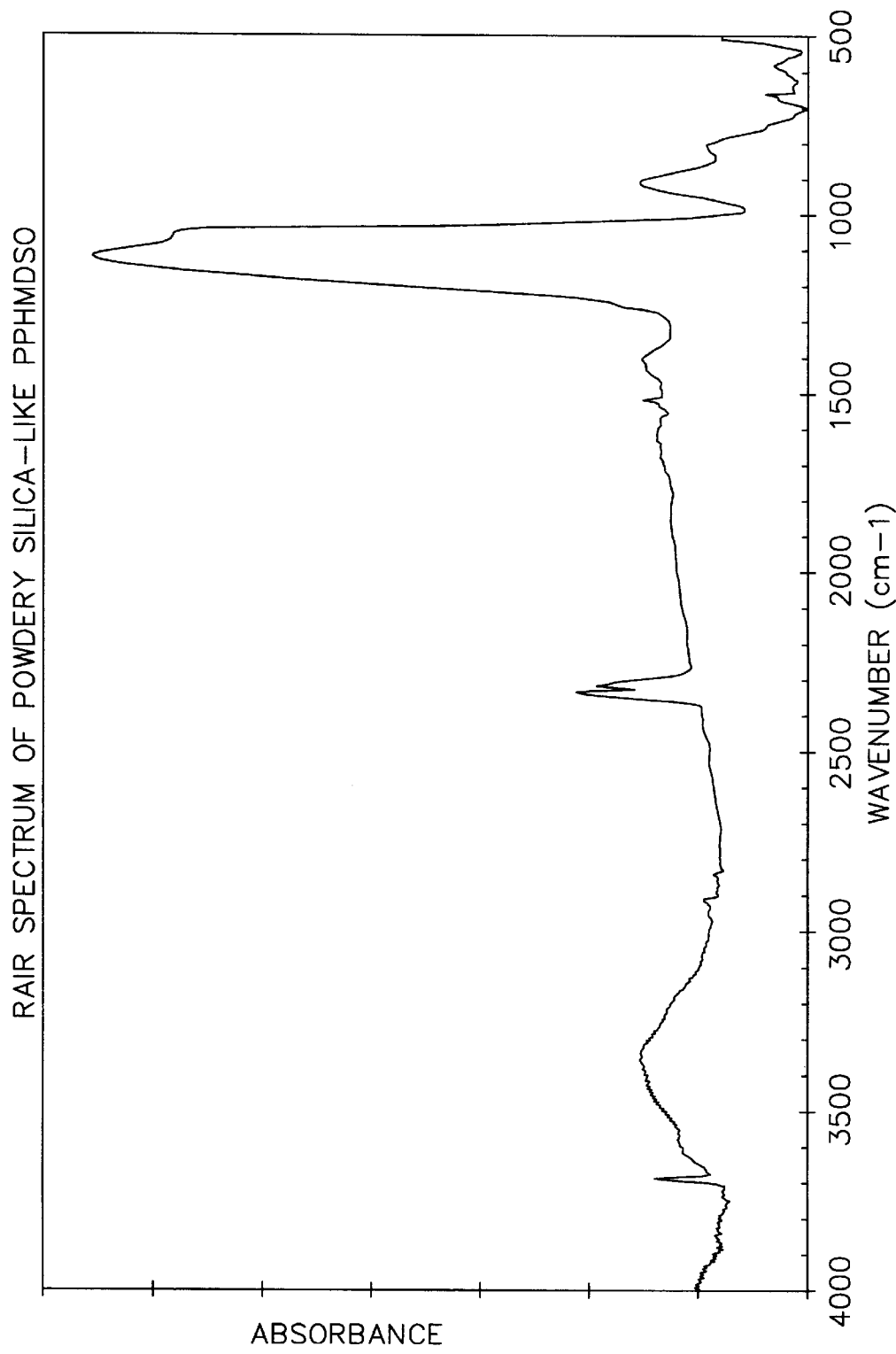
FIG. 3 is an infrared spectrum of a plasma polymerized film having a relatively high carbon content.
Figure 4:
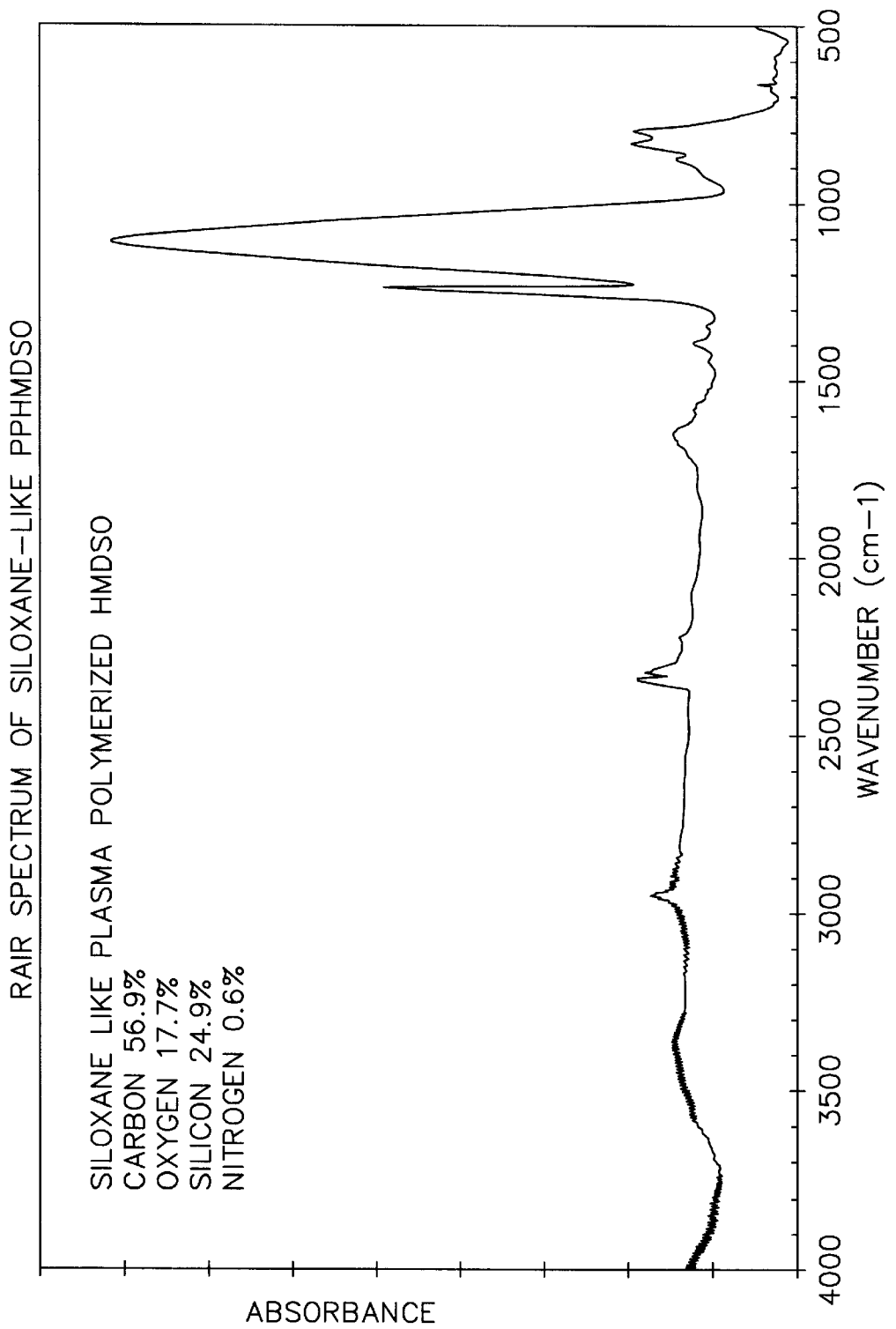
FIG. 4 is an infrared spectrum of a plasma polymerized film having a relatively high carbon content.

FIG. 3 is another infrared spectrum of a plasma polymerized HMDSO film on a substrate. The spectrum has a peaks at about 1275, 2850, and 2920 wave numbers, which are indicative of a carbon content. This should be contrasted with the spectrum in FIG. 2. FIG. 4 is another infrared spectrum in which the peak at 1275 wave numbers again indicates the presence of carbon. The film of FIG. 4 was analyzed and found to contain approximately 56.9% by weight carbon, 17.7% by weight oxygen, 24.9% by weight silicon, and 0.6% nitrogen. Table A contains operating parameters used for reactor R in applying the films of FIGS. 2, 3, and 4.

TABLE A

| Setting\Figure | FIG. 2. | FIG. 3. | FIG. 4. |
| --- | --- | --- | --- |
| Pressure | 0.500 Torr | 1.000 Torr | 1.000 Torr |
| Power | 200 Watts | 200 Watts | 200 Watts |
| Pulse | 1.5 milliseconds | 1.75 milliseconds | 1.75 milliseconds |
| HMDSO | 0.2 sccm | 1.5 sccm | 3.0 sccm |
| Argon | 5 sccm | 15 sccm | 25 sccm |
| Oxygen | 45 sccm | 20 sccm | None |
| Stage Height | 110 mm | 110 mm | 110 mm |
| Sample Rotation | 3 RPM | None | None |
| Comment | Silica-Like | Powdery-Silica-Like | Siloxane-Like |

Figure 5:
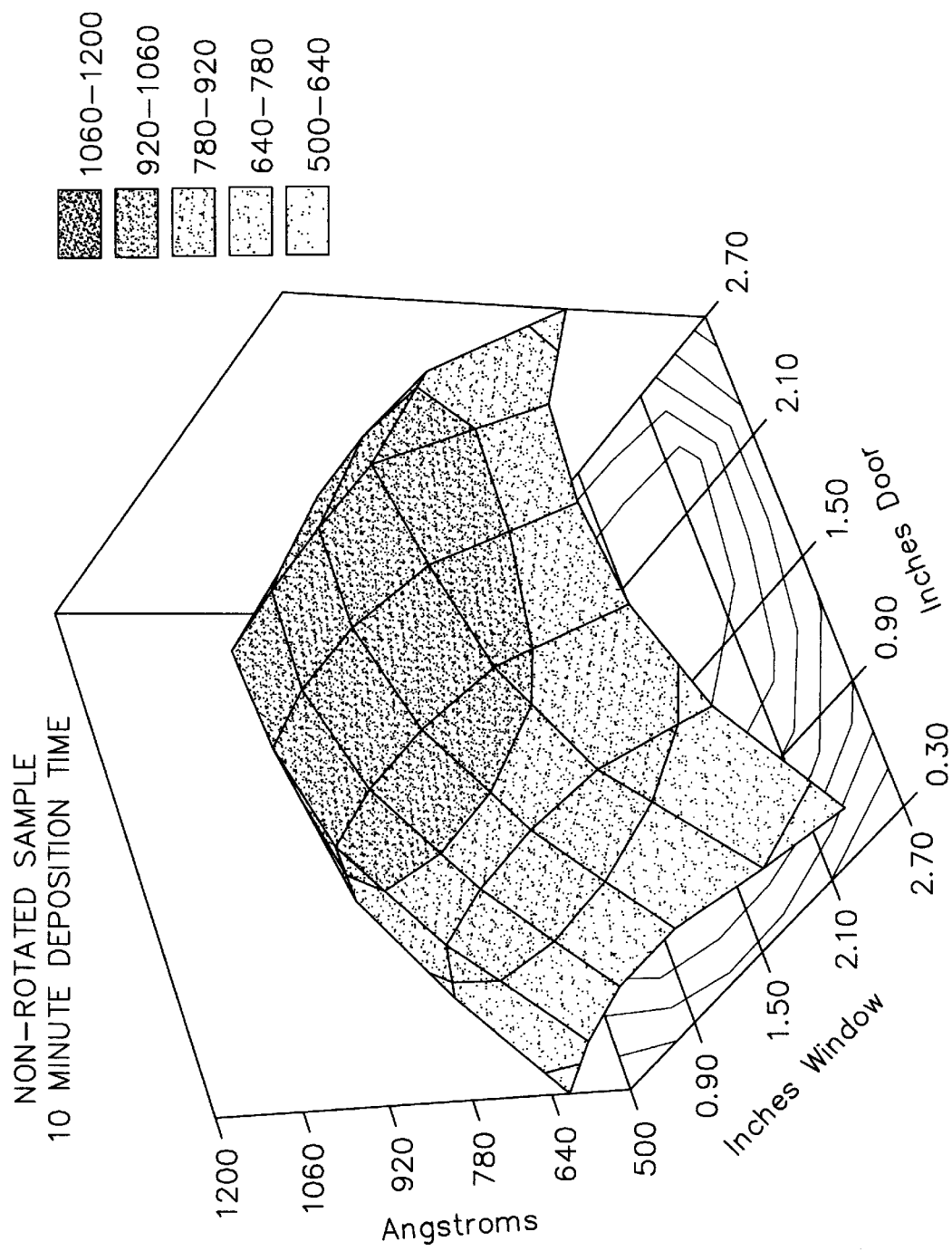
FIG. 5 is a deposition profile for a non-rotated sample produced pursuant to the invention.
Figure 6:
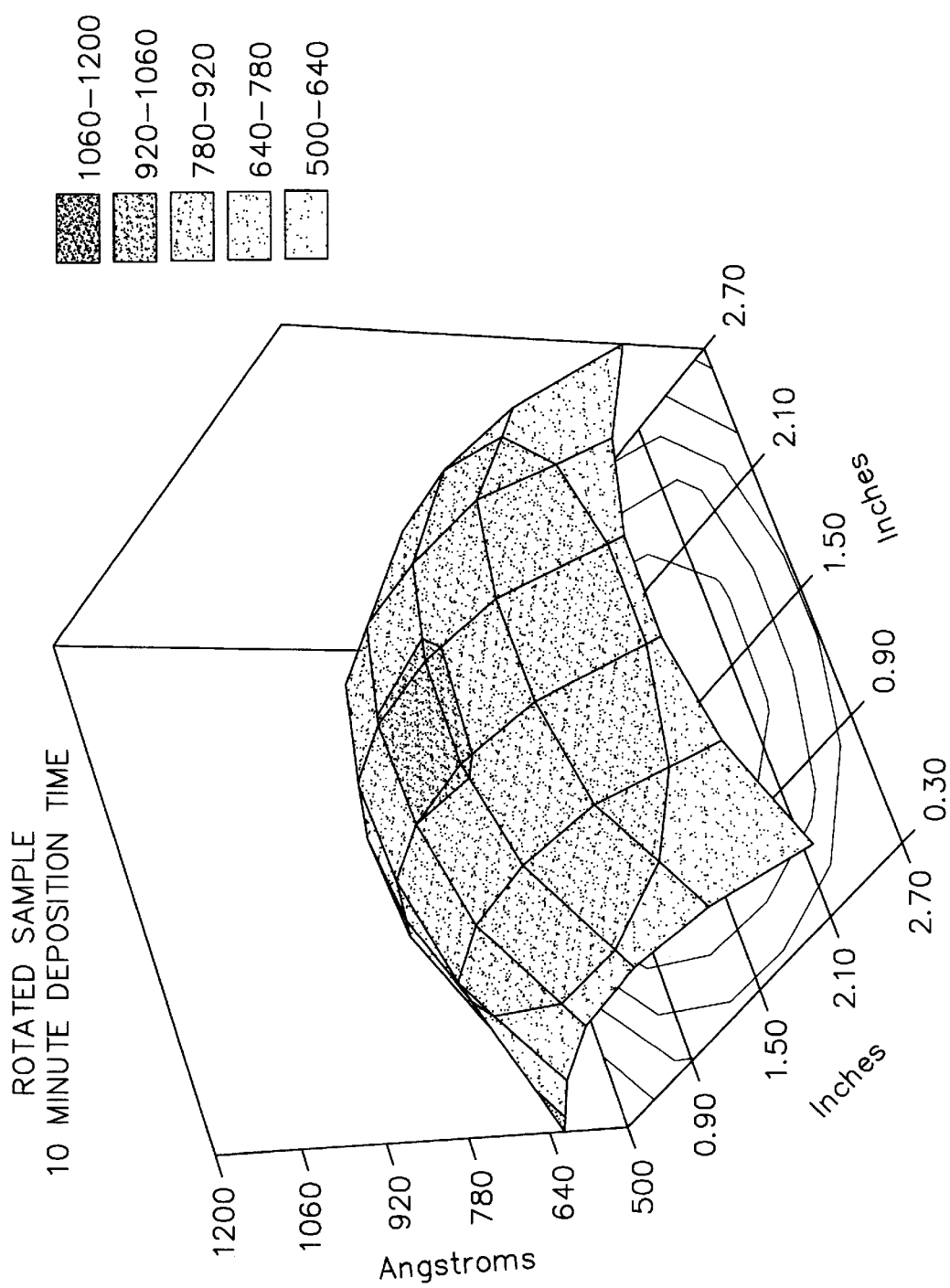
FIG. 6 is a deposition profile for a rotated sample produced pursuant to the invention.

FIG. 5 is a deposition profile of a plasma polymerized HMDSO film on a steel substrate. The table 20 was not rotated as the film was deposited onto the specimen. It can be seen in FIG. 5 that th e film depth is non-uniform, likely due to the orientati on of inlets 30 and 32. FIG. 6 is a comparable profile where the table 20 was rotated by shaft 18. It can be seen in FIG. 6 that the film profile or thickness is more uniform than with FIG. 5. FIGS. 5 and 6 thus illustrate that orientation of the monomer inlets needs to be considered in operation of a plasma polymerization microwave reactor.

We have found that increased results may b e achieved where the substrate surface to be coated is first plasma etched. The etching gas may be an inert gas such as argon, a reactive gas such as hydrogen, and oxygen or a mixture of both. The etching gas may be introduced through gas inlets 24 and 26. It is believed that plasma etching causes the substrate surface to be somewhat more reactive than otherwise would occur, with the result that deposition of the plasma polymerized film occurs more quickly and with greater adhesion.

Table 1 contains operating parameters for plasma pretreatment of electrogalvanized substrates.

TABLE 1

| Pretreatment Gas(es) | Flow Rate (sccm) | Pressure (Torr) | Time (Min.) | Forward Power (Watts) | Stage Height (mm) | Stage Size (mm) | Rotation |
| --- | --- | --- | --- | --- | --- | --- | --- |
| None | n/a | n/a | n/a | n/a | n/a | n/a | n/a |
| Argon | 20 | 0.5 | 10 | 200 | variable | 76.2 | no |
| Argon/Hydrogen | 25/5 | 0.5 | 10 | 200 | variable | 76.2 | no |
| Argon/Hydrogen | 25/10 | 0.5 | 10 | 200 | variable | 76.2 | no |
| Oxygen | 100 | 0.14 | 2 | 600 | n/a | n/a | n/a |

Table 2 provides operating parameters for plasma pretreatment of Galvalume substrates. Galvalume is a well known hot dip protective coat comprised of zinc and aluminum.

TABLE 2

| Pretreatment Gas(es) | Flow Rate (sccm) | Pressure (Torr) | Time (Min.) | Forward Power (Watts) | Stage Height (mm) | Stage Size (mm) | Rotation |
|---|---|---|---|---|---|---|---|
| None | n/a | n/a | n/a | n/a | n/a | n/a | n/a |
| Argon | 20 | 0.5 | 10 | 200 | 48 | 106.7 | Yes |
| Argon/Hydrogen | 5/20 | 0.5 | 10 | 200 | 48 | 106.7 | Yes |

Table 3 contains film thickness data for plasma polymerized film applied to the electrogalvanized steel substrate of Table 1. Data is given as determined both by ellipsometry and Auger analysis. The ellipsometry data is based upon averages and standard deviations, whereas thickness data determined by Auger analysis is in ranges.

TABLE 3

| Plasma Pretreatment | Thickness nm (Ellipsometry) | Thickness nm (Auger) |
|---|---|---|
| None | 553 ± 183 | 250–400 |
| Argon (20 sccm) | 600 ± 157 | 320–450 |
| Ar (25 sccm)/H2 (5 sccm) | 490 ± 186 | 250 |
| Ar (25 sccm)/H2 (10 sccm) | 229 ± 76 | 180–220 |

Table 4 contains film thickness data for Galvalume coated substrates produced pursuant to the parameters of Table 2, with the Galvalume having a chromate passivation coating applied thereto prior to the plasma etching.

TABLE 4

| Plasma Pretreatment | Thickness nm (Ellipsometry) | Thickness nm (Auger) |
|---|---|---|
| None | 722 ± 5 | 450–500 |
| Argon (20 sccm) | 687 ± 11 | 510–550 |
| Ar (5 sccm)/H2 (5 sccm) | 671 ± 7 | 520–550 |

Table 5 contains film thickness data for Galvalume substrates which have not had a chemical passivation treatment prior to plasma etching.

TABLE 5

| Plasma Pretreatment | Thickness nm (Ellipsometry) | Thickness nm (Auger) |
|---|---|---|
| None | 702 ± 4 | 420–425 |
| Argon (20 sccm) | 657 ± 0 | 440–460 |
| Ar (5 sccm)/H2 (20 sccm) | 557 ± 127 | 410–440 |

Figure 11:
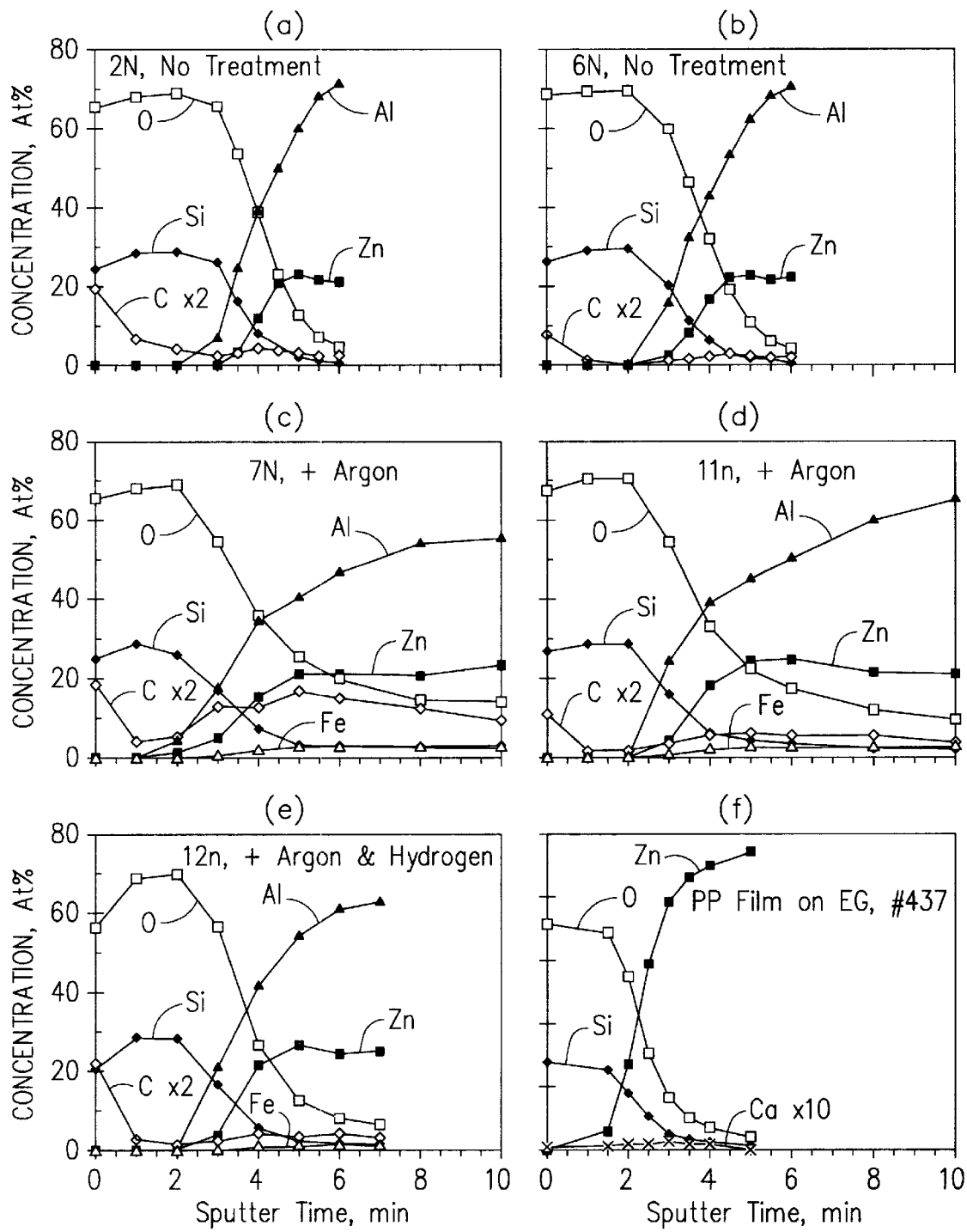
FIGS. 11(a)–(f) contain Auger analyses of non-chemically treated Galvalume coupons produced under the noted pretreatment conditions, with the analysis extending a total sputter depth of 1000 nm.
Figure 12:
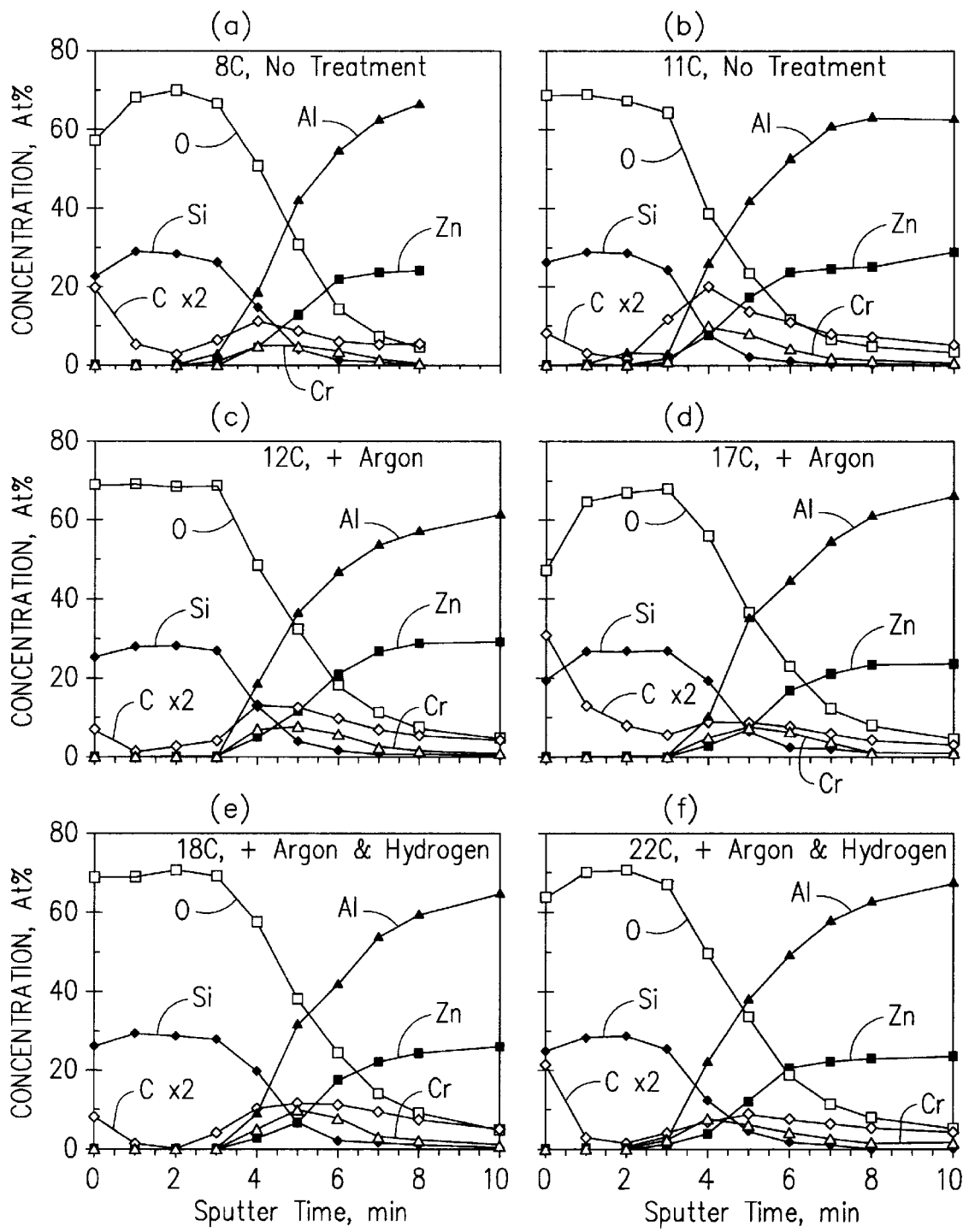
FIGS. 12(a)–(f) contain Auger analyses of chemically treated Galvalume coupons produced under the noted pretreatment conditions, with the analysis extending a total sputter depth of 1000 nm.
Figure 13:
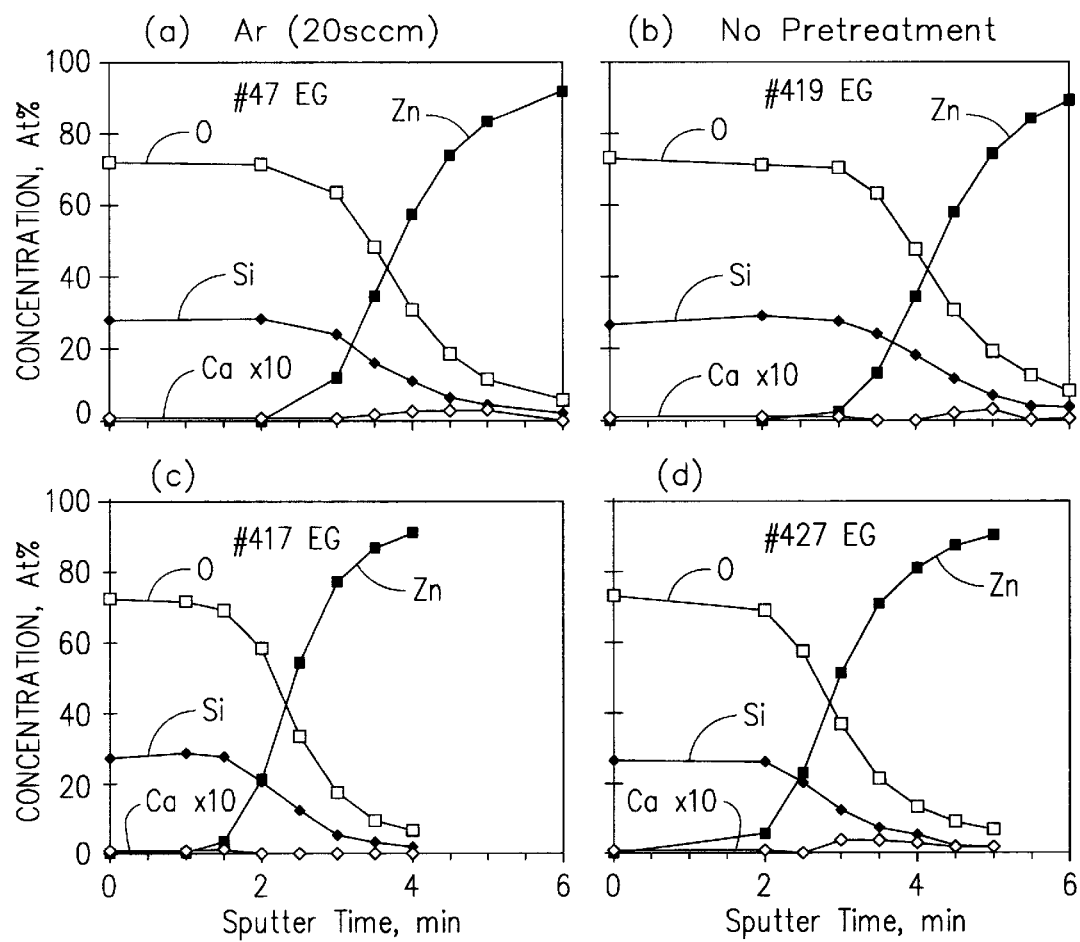
FIGS. 13(a)–(d) contain Auger depth profiles of electrogalvanized coupons, with the analysis extending a total sputter depth of 600 nm.
Figure 15:
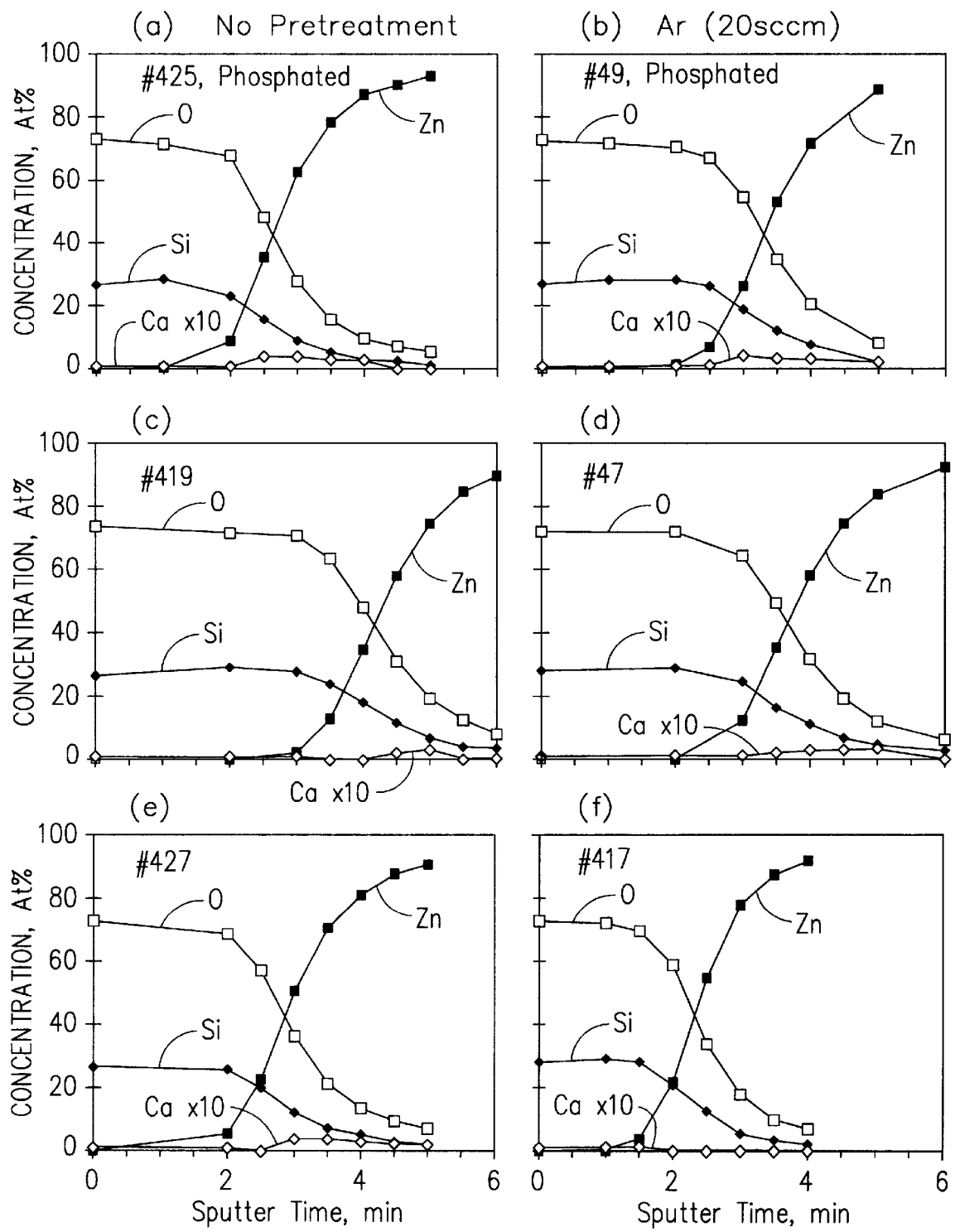
FIGS. 15(a)–(f) contain Auger depth profiles of plasma coated electrogalvanized coupons, with analysis extending a total sputter depth of 600 nm.

A comparison of the data of Tables 4 and 5 suggests that the passivated Galvalume of Table 4 has a slightly thicker and more consistent silica-like film than the non-chemically treated substrates of Table 5, as best shown in FIGS. 11 and 12. The most consistent and thickest films for both the non-chemically treated and chemically treated Galvalume substrates where on those having no plasma pretreatment. Augur surface analysis, as best shown in FIGS. 13 and 15, on the substrates of Tables 4 and 5 indicated the presence of silicon, oxygen, and a minimal amount of carbon. Zinc, aluminum, silicon, oxygen, and carbon where found at the interface of the plasma deposited film and the metal coating of the non-chemically treated Galvalume substrates. Calcium and iron were found at the interface of the plasma deposited film and the metal coating from the plasma pretreated Galvalume substrates. The oxygen concentration profiles of the non-chemically treated Galvalume substrates did not follow those of silicon as did the electrogalvanized substrates, but continued at a higher concentration to the interface. This suggested that the oxygen was associated with the aluminum from the Galvalume coating as an oxide.

Carbon, potassium, chromium, and calcium were found at the interface of the plasma deposited film and the metal coating of the chemically treated Galvalume samples. No iron was found at the interface. The oxygen profiles where similar to those of the non-chemically treated Galvalume substrates. The oxygen appears to be associated with the chromium as a chromate, and not with the aluminum as an oxide.

Figure 14:
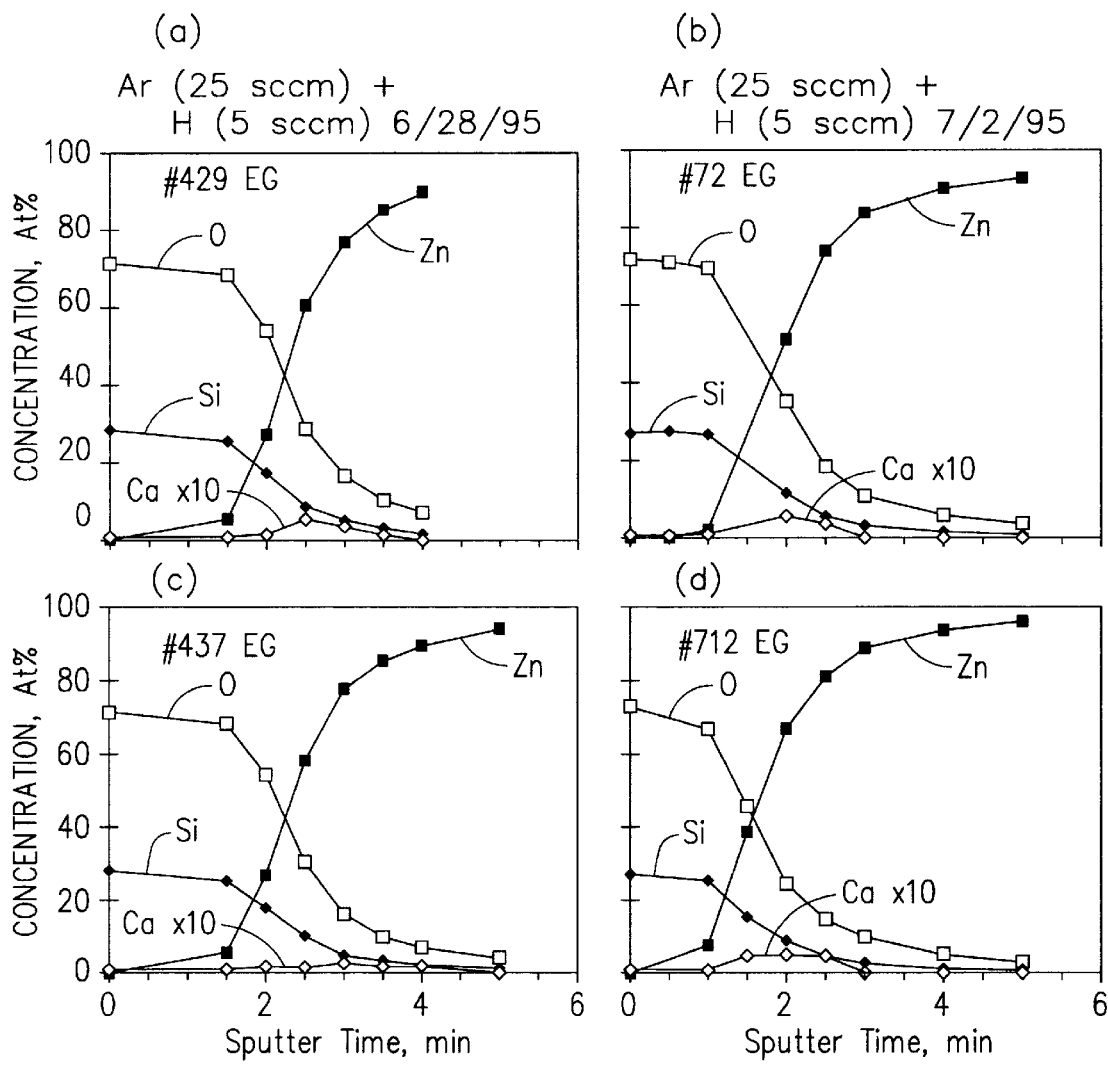
FIGS. 14(a)–(d) contain Auger depth profiles of plasma coated electrogalvanized coupons, with the analysis extending a total sputter depth 600 nm.
Figure 16:
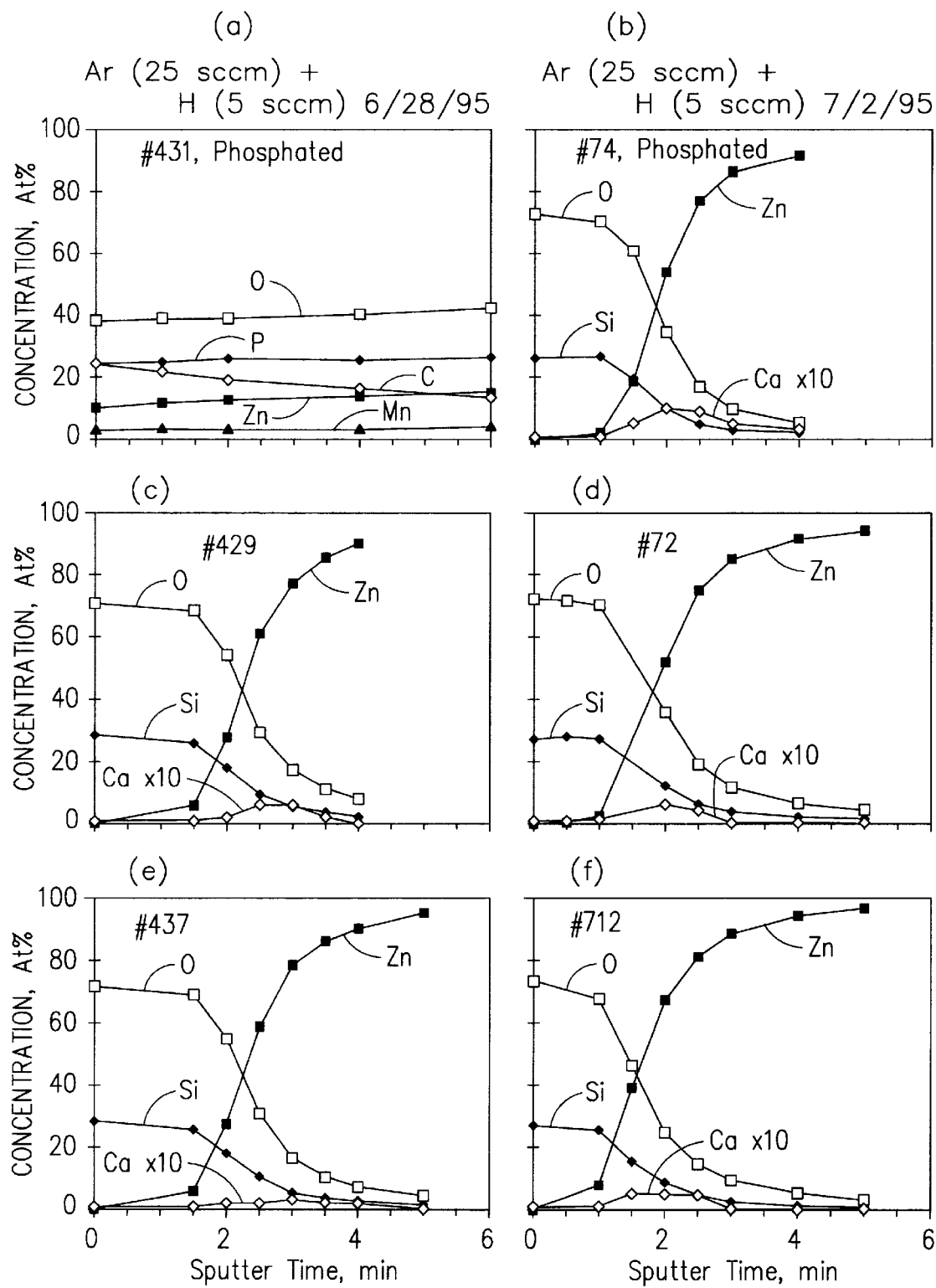
FIGS. 16(a)–(f) contain Auger depth profiles of plasma coated electrogalvanized coupons, with the analysis extending a total sputter depth of 600 nm.

With regard to the data of Table 3, the argon pretreatment produced the thickest and most consistent silica-like plasma polymerized films. Auger spectra, as best shown in FIGS. 14 and 16, indicated that the interface region between the plasma polymerized film and the metal coating contained zinc from the electrogalvanized coating, silicon and oxygen from the plasma polymerized film, and trace contaminants of calcium, carbon, and sulfur. It could not be determined whether the oxygen at the interface was chemically bonded to zinc as a zinc oxide, because the peaks where too close to permit distinction.

Auger analysis also indicated that the components of the phosphate treatment, namely, phosphorous, manganese, and zinc, were not present on the surface of plasma coated electrogalvanized substrates after phosphate treatment. This suggests that the silica-like coatings are not affected by the phosphate treatment.

Electrical surface resistivity, which measures the current needed to weld, provides an indication of expected tip life. These measurements provide an indication of the weldability of the resulting material. The plasma coated electrogalvanized substrates had a surface resistance similar to non-plasma coated electrogalvanized substrates, with these results suggesting that the spot weldability should not be affected. Table 6 provides data on electrical surface resistance.

TABLE 6

| Material | Tip Life | Resistance ($\mu\Omega$) |
|---|---|---|
| EG | 6800 | 7 |
| EG and PPHMDSO | n/a | 60 |
| EG and Phosphate A | 1800 | 297 |
| EG and Phosphate B | 100 | 399 |

Figure 7:
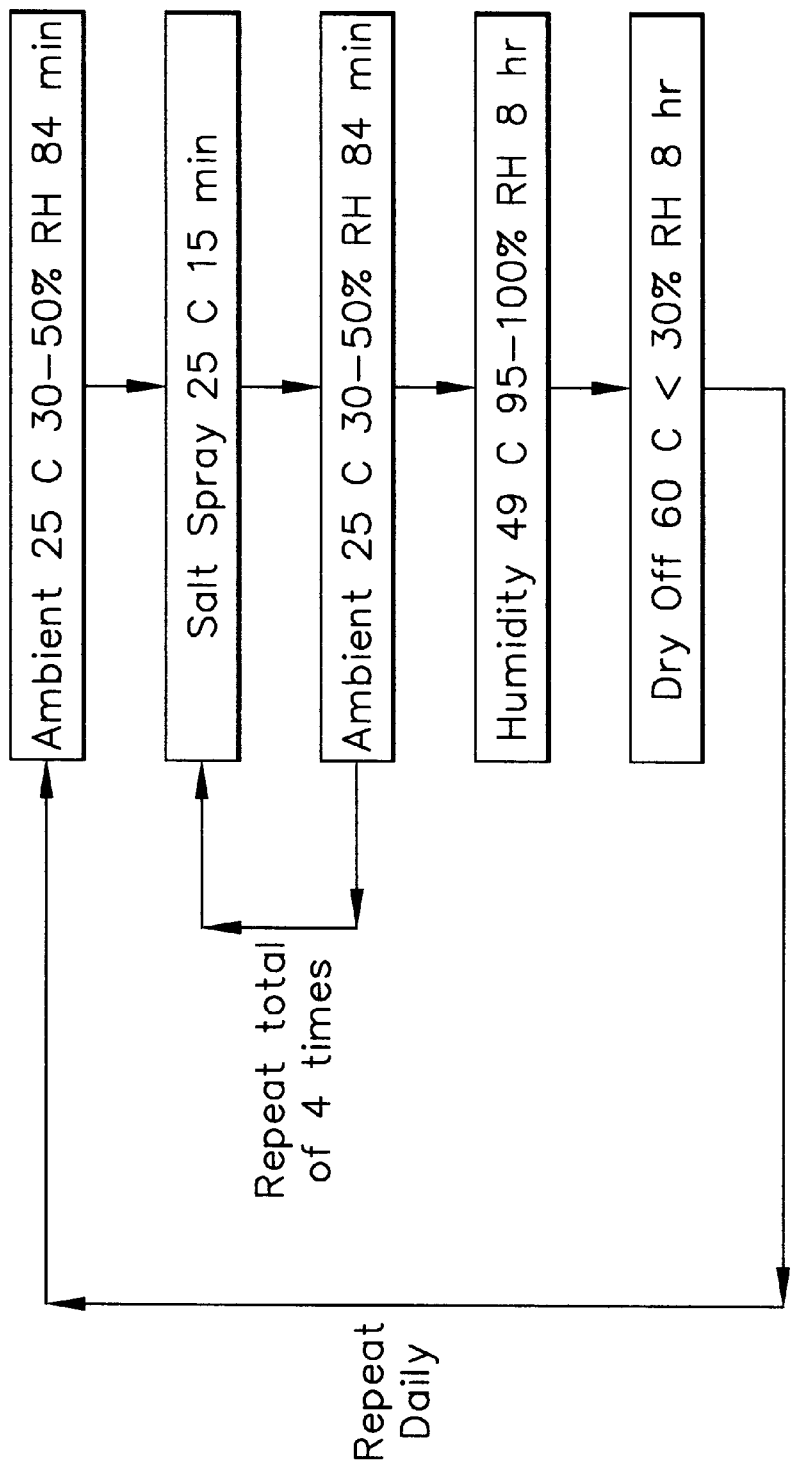
FIG. 7 is a block diagram of the GM9540P(B) corrosion test cycle.
Figure 8:
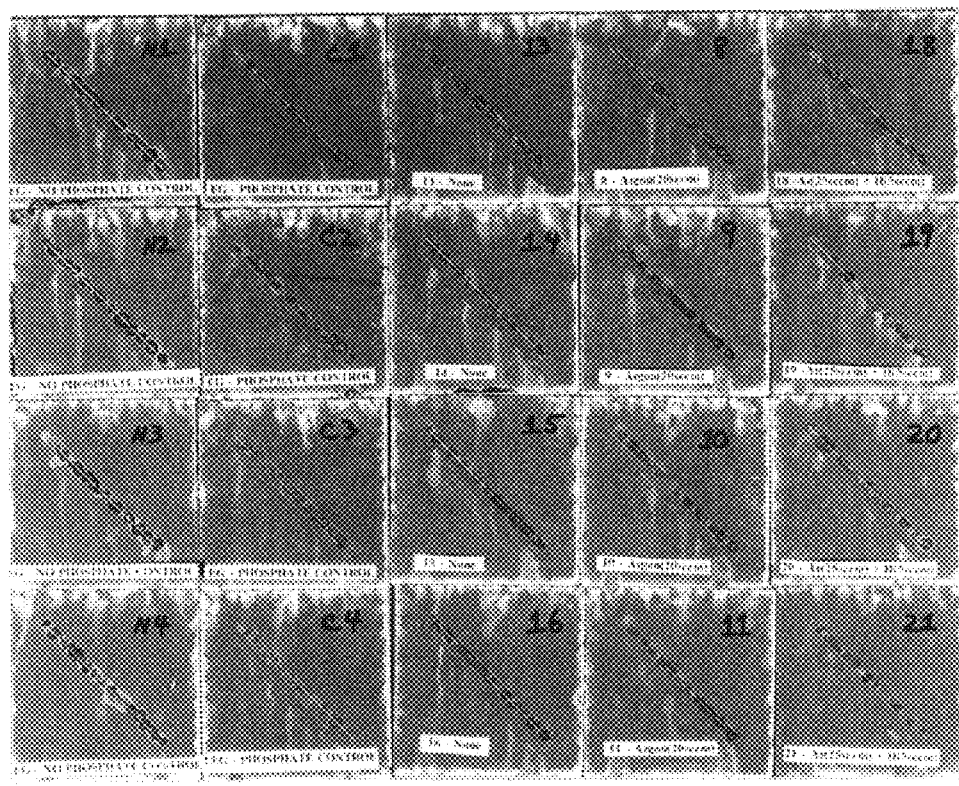
FIG. 8 is a reduced form of 20 photographs of samples of electrogalvanized steel subjected to the GM9450P(B) corrosion test.

As noted earlier, steel strip of the sort to which the coatings of the invention are applied has utility in various environments, with the result that the coatings need to be evaluated for their resistance to corrosion. General Motors Corporation has developed laboratory cyclic test GM9540P (B) in order to evaluate automotive materials. Good correlations have been reported with 5 year on-vehicle tests conducted in severely corrosive environments. FIG. 7 is a schematic diagram illustrating the test sequence. In order to evaluate the coatings of the invention, we exposed electrogalvanized substrates having plasma polymerized coatings according to the invention under various conditions to 40 cycles of GM9540P(B) testing. FIG. 8 contains photographs of the results. The coated coupons were diagonally scribed with a carbide lathe tool, through both the protective coating and zinc layer, to expose the steel substrate. The coupons where placed at 15 degrees to the vertical. After 40 cycles of testing, the coupons were soaked in warm water for 30 min., and loose paint at the scribe was removed by air blasting followed by adhesive tape pulls. Specimens were rated by measuring the extent of paint removal at the scribes.

Table 7 contains summary data for the results of the coupons of FIG. 8. The results indicate that the performance of phosphated electrogalvanized is significantly better than that of un-phosphated electrogalvanized. Plasma polymerized films applied to electrogalvanized are at least as good, and perhaps slightly better than phosphated electrogalvanized. This suggests that plasma polymerized films may be substituted for phosphating without any sacrifice in corrosion resistance. In the testing, Treatment A involved no sputter etching of the substrate, Treatment B involved sputter etching with argon, Treatment C involved sputter etching with an argon (5 sccm) hydrogen (20 sccm) mixture, and Treatment D involved sputter etching with an argon (25 sccm) and hydrogen (5 sccm) mixture.

TABLE 7

| Material | Phosphate Treatment | PP Treatment | Average Scribe Creep, mm | Std Dev, mm |
|---|---|---|---|---|
| EG Control | No | No | 4.1 | 1.3 |
| EG Control | Yes | No | 2.4 | 1.2 |
| PP EG | Yes* | A | 2 | 1.2 |
| PP EG | Yes* | B | 1.6 | 1 |
| PP EG | Yes* | D | 1.8 | 1.2 |

Figure 9:
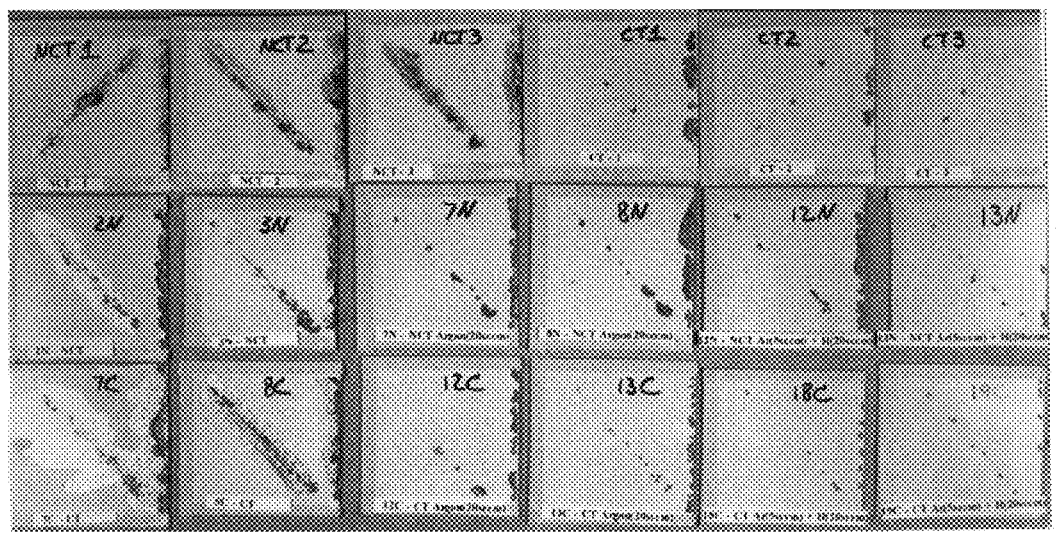
FIG. 9 is 18 reduced sized photographs of painted Galvalume® after being subjected to the B117 salt spray test.

*Chemical analysis indicated that the plasma polymerized films protected the EG substrates from reacting with the phosphating solution, so that no phosphate was deposited onto them FIG. 9 contains photographs of test coupons after a 750 hour exposure to a B117 salt spray test. This test is routinely used to qualify pretreatments, paints, and coating facilities intended for prepainted Galvalume. In this regard, painted Galvalume coupons where diagonally scribed though the paint to the metal coating with a carbide pencil. Approximately one quarter inch was sheared from one edge of the coupon. The other three edges where protected by electroplaters tape. The coupons were oriented at 15 degrees to the vertical, and were in a continuous fog of 5% sodium chloride. After 750 hours of salt-spray exposure, the coupons where soaked in warm water for 30 min., scrapped with a blunt spatula, and taped to remove lost paint.

Table 8 contains a summary of the data for the salt spray tests of FIG. 9.

TABLE 8

| Material | Iridite 9L6 | Bonderite 1310 | PP Treatment | Scribe Creep, mm Avg Std Dev (1) | | Edge Creep, mm Avg Std Dev (1) | |
|---|---|---|---|---|---|---|---|
| NCT Galvalume Control | No | No | No | 6.9 | 2.0 | 4.4 | 2.1 |
| NCT Galvalume Control | No | Yes | No | 0.2 | 0.5 | 1.0 | 1.8 |
| NCT Galvalume | No | No | A | 6.0 | 4.8 | 3.0 | 1.8 |
| NCT Galvalume | No | No | B | 0.6 | 0.9 | 2.6 | 1.6 |
| NCT Galvalume | No | No | C | 0.2 | 0.6 | 0.9 | 1.2 |
| CT Galvalume | Yes | No | A | 16.2 | 4.0 | 10.7 | 6.2 |
| CT Galvalume | Yes | No | B | 0.8 | 1.0 | 1.3 | 1.4 |
| CT Galvalume | Yes | No | C | 0.2 | 0.6 | 0.2 | 0.6 |

The data suggests that the resistance to paint creep is significantly enhanced by treatment with a conventional chromate pretreatment known as Bonderite 1310. The performance of the plasma polymerized films varied with the type of sputter-etching conducted in the reactor prior to plasma film deposition. Compared to conventional chromate pretreatment, no sputter etching was relatively poor, sputter etching in argon only was almost as good, and sputter etching in argon and hydrogen mixtures was at least as good. Thus, the condition of the surface appears to be a critical factor in determining the effectiveness of the plasma polymerized film as a pretreatment for Galvalume. The results do suggest, however, that the plasma polymerized films may be substituted for conventional chromium pretreatment on prepainted Galvalume.

Figure 10:
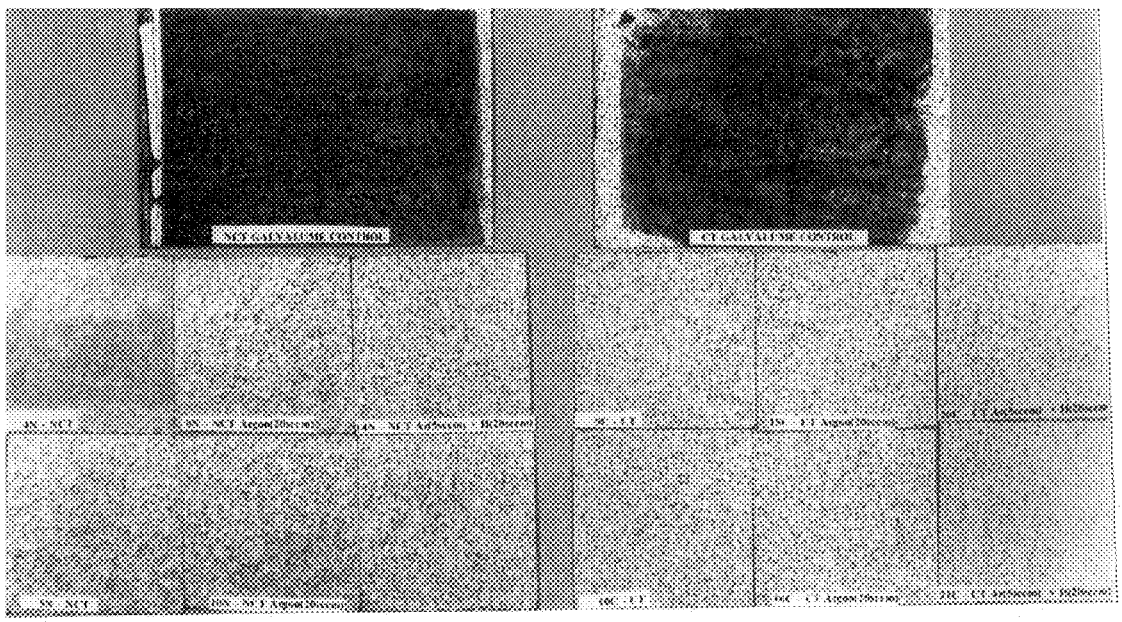
FIG. 10 is 14 reduced sized photographs of Galvalume coupons after 1000 hours of being subjected to a Cleveland condensate test.

FIG. 10 contains results of Galvalume coupons after 1000 hours exposure to a Cleveland condensate test. This test is commonly used to evaluate the effectiveness of chromate passivation treatments in protecting galvanized and Galvalume sheet against storage staining where coils or stacks of sheet are exposed to humid conditions. Coupons of plasma polymerized Galvalume according to the invention, along with chemically treated ("CT") and non-chemically treated ("NCT") Galvalume coupon controls, were exposed for 1000 hours in a Q-Panel Cleveland condensing humidity cabinet. In this test, the test side of a coupon is exposed to water-saturated air at 60° C., with the other side being exposed to ambient air. This produces continual condensation of pure water on the test surface. Coupons were visually rated twice weekly for the appearance of black stain.

Table 9 contains a summary of the results of the test coupons of FIG. 10.

TABLE 9

| Material | Iridite 9L6 | PP Treatment | Area Percent Black Stain | Time to 100% stain, days |
|---|---|---|---|---|
| NCT Galvalume Control | No | No | 100 | ≤4 |
| NCT Galvalume Control | Yes | No | 100 | ≤14 |
| NCT Galvalume | No | A | 0 | >42 |
| NCT Galvalume | No | B | 0 | >42 |
| NCT Galvalume | No | C | 0 | >42 |
| CT Galvalume | Yes | A | 0 | >42 |
| CT Galvalume | Yes | B | 0 | >42 |
| CT Galvalume | Yes | C | 0 | >42 |

Non-chemically treated Galvalume was completely covered with black stain in fewer than three days. Application of Iridite 9L6 chromate passivation treatment delayed staining for fewer than 14 days. With the plasma polymerized films of the invention, however, both non-chemically treated and chemically treated Galvalume remained free of black stain throughout the duration of the 42 day test. No differences among the three plasma polymerization treatments where apparent. These results suggest that plasma polymerization treatment provides a significant improvement in wet stain resistance compared to conventional chromate passivation.

Substrates coated pursuant to the invention were also tested for paint adhesion by impacting the painted Galvalume panel with a drop weight at 80 inch pounds with a Gardiner tester. The impact area was hit a second time from the reverse side. Adhesive tape was then applied to the resulting domed area, and loose painted was removed by pulling the tape. Adhesion was rated visually on a scale from 1 to 10. Due to the limited amount of coupons available, the adhesion tests were performed on the painted samples after salt-spray testing and drying for 1 week.

Table 10 contains a summary of the paint adhesion ratings.

TABLE 10

| Material | Iridite 9L6 | Bonderite 1310 | PP Treatment | Adhesion Rating (1) |
|---|---|---|---|---|
| NCT Galvalume Control | No | No | No | 2, 2, 2 |
| NCT Galvalume | No | No | A | 2, 2 |
| NCT Galvalume | No | No | B | 6, 6 |
| NCT Galvalume | No | No | C | 9, 9 |
| CT Galvalume | Yes | No | A | 2 |
| CT Galvalume | Yes | No | B | 6, 8 |
| CT Galvalume | Yes | No | C | 4, 8 |

[1]where the following designates the results:
10 perfect, no coating removed
9 good, slight removal
8 some removal
6 moderate removal
4 considerable removal
2 bad It can be seen from Table 10 that paint adhesion was poor for Galvalume which did not have a chromate pretreatment. Likewise, plasma polymerized films applied without sputter-etching (treatment A) also had poor adhesion ratings. The results suggest that adhesion improves with sputter etching, and that the best results were obtained for plasma polymerized films applied to non-chemically treated Galvalume that had been sputter-etched in argon and hydrogen mixtures (Treatment C). This suggests that surface cleanliness before plasma polymerization treatment is important for good paint adhesion with Galvalume.

Figure 17:
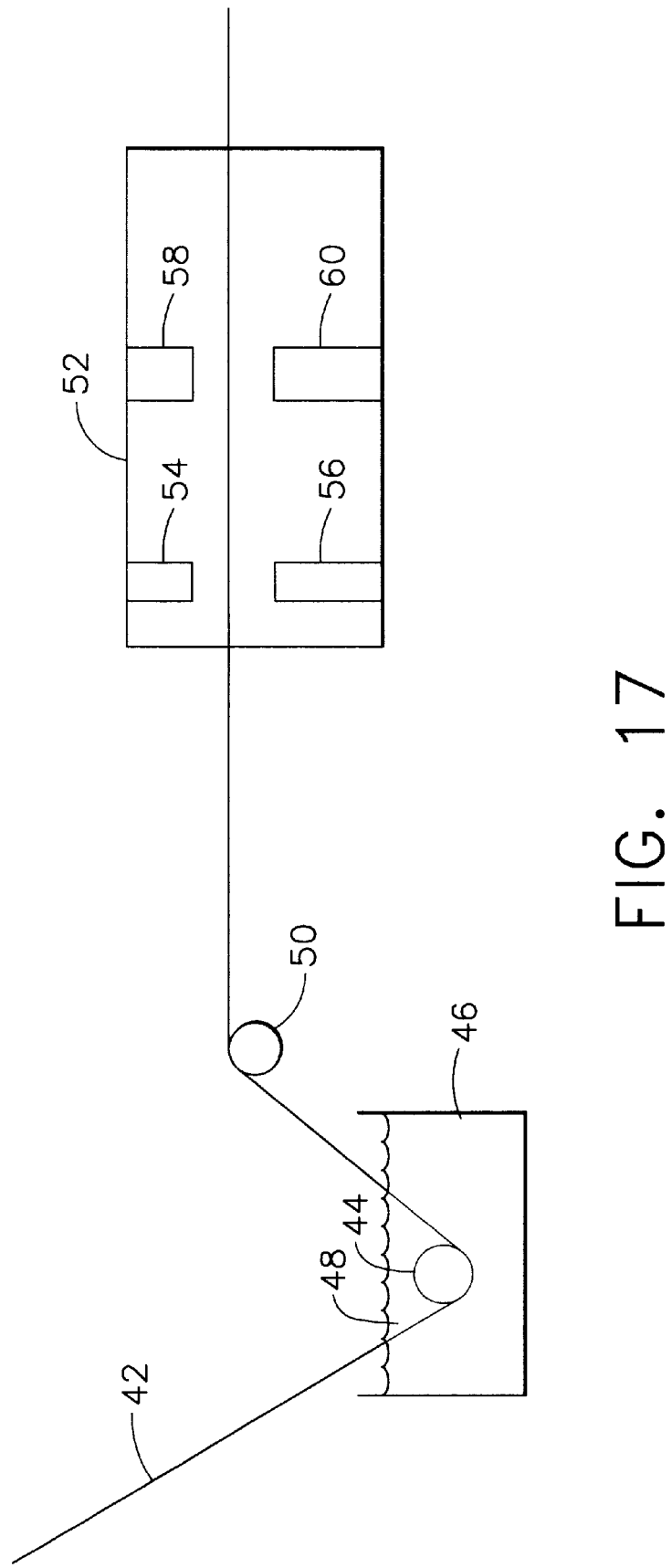
FIG. 17 is a schematic view of a steel coating line for applying hot dip galvanized coating to steel strip and plasma polymerized coating pursuant to the invention.

FIG. 17 is a schematic diagram of a coating system for applying galvanized material and plasma polymerization films to steel strip. As illustrated therein, strip 42 loops about roll 44 within pot 46 containing hot dip galvanize material 48. The strip loops about roll 50 and enters reactor 52, having plasma etching stations 54 and 56 upstream of plasma polymerization film stations 58 and 60. The strip then exits reactor 52 for coiling or other treatment.

While this invention has been described as having a preferred design, it is understood that it is capable of further modification, uses, and/or adaptation following in general the principle of the invention and including such departures from the present disclosure as come within known or customary practice in the art to which the invention pertains, and as may be applied to the essential features set forth herein, and fall within the scope of the invention limited by the appended claims.

What we claim is:

1. A method of applying silica coatings to substrates, comprising the steps of:
   a) generating a plasma;
   b) locating a zinc containing steel substrate in spaced relation to the plasma;
   c) introducing a reactive carrier gas, consisting essentially of oxygen, to the plasma and thereby causing the formation of reactive ions;
   d) introducing an organosilicon material in operative association to the plasma and spaced therefrom, and thereby causing to be created a substantially carbonless reaction product resulting from the reaction of the organosilicon material and the reactive ions;
   e) maintaining the substrate surface in operative association with the plasma for a period sufficient to cause coating of the surface by the reaction product, wherein excess said oxygen in relation to said organosilicon material is utilized so that a silica coating is formed on the substrate surface.

2. The method of claim 1, including the step of:
   a) supplying the carrier gas at a ratio of about 200:1 to the oraganosilicon material.

3. The method of claim 1, including the step of:
   a) generating the plasma with an alternating current power supply.

4. The method of claim 3, including the step of:
   a) generating the plasma with a microwave powered reactor.

5. The method of claim 4, including the step of:
   a) pulsing the power supplied to the reactor.

6. The method of claim 5, including the step of:
   a) pulsing the power at a frequency of about 500 Hz.

7. The method of claim 2, including the step of:
   a) generating the plasma with alternating current power supplied at about $16 \times 10^8$ J/kg.

8. The method of claim 7, including the step of:
   a) supplying the organosilicon material as a monomer.

9. The method of claim 8, including the step of:
   a) supplying as the monomer a material selected from the group consisting of HMDSO, tetramethoxysilane, and trimethylsilane.

10. The method of claim 1, including the step of:
    a) plasma etching the surface prior to introducing the organosilicon material.

11. The method of claim 10, including the step of:

a) plasma etching the surface under the influence of a gas selected from the group consisting of inert gases, hydrogen, and mixtures thereof.

12. The method of claim 1, including the step of:

a) generating the plasma in the presence of a vacuum.

13. The method of claim 1, including the step of:

a) providing the zinc containing steel substrate in moving strip form.

* * * * *